(12) United States Patent
Park

(10) Patent No.: US 7,638,977 B2
(45) Date of Patent: Dec. 29, 2009

(54) BATTERY PACK PROTECTIVE CIRCUIT FOR DETECTING OVERCHARGE OR WIRE DISCONNECT

(75) Inventor: Tae Heom Park, Youngin-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 128 days.

(21) Appl. No.: 11/292,416

(22) Filed: Nov. 29, 2005

(65) Prior Publication Data

US 2006/0139008 A1    Jun. 29, 2006

(30) Foreign Application Priority Data

Nov. 29, 2004    (KR) ...................... 10-2004-0098834

(51) Int. Cl.
*H02J 7/00*    (2006.01)

(52) U.S. Cl. ...................... 320/136; 320/134; 320/162; 361/88; 361/93.1

(58) Field of Classification Search ................ 320/116, 320/123, 134, 162–164; 324/428, 432, 433; 340/636.17; 361/18, 93.1
See application file for complete search history.

(56) References Cited

U.S. PATENT DOCUMENTS

| | | | | |
|---|---|---|---|---|
| 4,442,706 A | * | 4/1984 | Kawate et al. | .................. 73/86 |
| 4,844,038 A | * | 7/1989 | Yamato et al. | .............. 123/685 |
| 5,001,465 A | * | 3/1991 | Siegel | .......................... 340/685 |
| 5,642,030 A | * | 6/1997 | Seelye | ......................... 320/101 |
| 5,773,962 A | * | 6/1998 | Nor | ............................. 320/134 |
| 5,811,959 A | * | 9/1998 | Kejha | ......................... 320/126 |
| 6,049,140 A | * | 4/2000 | Alksnat et al. | ............. 307/10.2 |
| 6,075,344 A | * | 6/2000 | Kawai | ........................ 320/134 |

(Continued)

FOREIGN PATENT DOCUMENTS

JP    2000-340267    12/2000

(Continued)

OTHER PUBLICATIONS

Patent Abstracts of Japan for Publication No. 2001-116776; Date of publication of application Apr. 27, 2001, in the name of Osawa Naoki et al.

(Continued)

*Primary Examiner*—Edward Tso
*Assistant Examiner*—Arun Williams
(74) *Attorney, Agent, or Firm*—Christie, Parker & Hale, LLP

(57) ABSTRACT

A protective circuit of a battery pack and a method of operating the protective circuit prevents the battery cells from being overcharged by directly detecting overcharge or detecting disconnection of sensing wires, which sense the voltage of battery cells, and instantly shuts off the high current being applied to the battery cells when the sensing wires are disconnected. The protective circuit includes at least one battery cell, and a cell voltage detecting unit adapted to detect the voltage of the battery cell. The protective circuit also includes a switch unit, and a control unit adapted to receive a signal from the cell voltage detecting unit and generate a predetermined control signal based on the signal of the cell voltage detecting unit in order to turn off the switch unit when the battery cell is overcharged or the sensing wire is disconnected.

19 Claims, 2 Drawing Sheets

U.S. PATENT DOCUMENTS

| | | | | |
|---|---|---|---|---|
| 6,172,482 | B1* | 1/2001 | Eguchi | 320/134 |
| 6,396,246 | B2* | 5/2002 | Haraguchi et al. | 320/134 |
| 6,424,158 | B2* | 7/2002 | Klang | 324/433 |
| 6,577,883 | B1 | 6/2003 | Ueda | |
| 6,687,103 | B2* | 2/2004 | Pannwitz | 361/90 |
| 6,873,135 | B2* | 3/2005 | Nakatsuji | 320/132 |
| 6,879,132 | B2* | 4/2005 | Oki et al. | 320/128 |
| 2002/0043959 | A1* | 4/2002 | Tanaka et al. | 320/116 |
| 2002/0195996 | A1* | 12/2002 | Nakatsuji | 320/127 |
| 2003/0044689 | A1* | 3/2003 | Miyazaki et al. | 429/320 |
| 2003/0102845 | A1* | 6/2003 | Aker et al. | 320/139 |
| 2003/0132732 | A1 | 7/2003 | Thomas et al. | |
| 2004/0217737 | A1 | 11/2004 | Popescu | |
| 2004/0257038 | A1* | 12/2004 | Johnson et al. | 320/116 |
| 2005/0242779 | A1* | 11/2005 | Yoshio | 320/134 |
| 2006/0017581 | A1* | 1/2006 | Schwendinger et al. | 340/636.1 |

FOREIGN PATENT DOCUMENTS

JP    2001-116776    4/2001

OTHER PUBLICATIONS

Patent Abstracts of Japan for Publication No. 2000-340267; Date of publication of application Dec. 8, 2000, in the name of Tamai Mikitaka et al.

* cited by examiner

BATTERY PACK PROTECTIVE CIRCUIT FOR DETECTING OVERCHARGE OR WIRE DISCONNECT

This application claims priority to and the benefit of Korean Patent Application No. 10-2004-0098834, filed on Nov. 29, 2004, in the Korean Intellectual Property Office, the entire content of which is incorporated herein in its entirety by reference.

BACKGROUND OF THE INVENTION

1. Field of the Invention

The present invention relates to a protective circuit of a battery pack. More particularly, the present invention relates to a protective circuit of a battery pack, capable of detecting disconnection of a sensing wire, which senses a voltage of a battery cell, while preventing overcharge of the battery cell.

2. Description of the Related Art

As generally known in the art, a battery cell is typically not used as a power source for a notebook personal computer and the like because the battery cell has low capacity and operational voltage. Thus, a battery pack or a battery cell module including a plurality of battery cells coupled to each other in series is used as a power source for the notebook personal computer.

Such a battery pack is assembled with a protective circuit in order to control the charge/discharge state of the battery cell while protecting the battery pack from various hazards derived from the overcharge or over-discharge of the battery cell. In addition, a sensing wire is coupled to the protective circuit in order to detect the voltage of each battery cell. For instance, when the battery pack includes three battery cells coupled to each other in series, four sensing wires are required. In this case, a first sensing wire is coupled to a negative electrode of a first battery cell in order to detect a minimum voltage, a second sensing wire is coupled between a positive electrode of the first battery cell and a negative electrode of the second battery cell so as to detect a maximum voltage of the first battery cell (or, a minimum voltage of the second battery cell), a third sensing wire is coupled between a positive electrode of the second battery cell and a negative electrode of the third battery cell so as to detect a maximum voltage of the second battery cell (or, a minimum voltage of the third battery cell), and a fourth wire is coupled to a positive electrode of the third battery cell in order to detect a maximum voltage of the third battery cell.

According to the circuit structure having the above construction, the voltage of the first battery cell is detected by means of first and second wires, the voltage of the second battery cell is detected by means of second and third wires, and the voltage of the third battery cell is detected by means of third and fourth wires, respectively.

Therefore, the voltage of each battery cell can be detected, so the overcharge of all battery cells or a specific battery cell can be detected. If the overcharge of the battery cell is detected, the charge operation for the battery cell is instantly stopped.

However, the conventional protective circuit presents a problem in that there is no apparatus or method for detecting disconnection of a specific sensing wire. For instance, if the second wire is disconnected, the total voltage of the battery cells can be detected by means of the first and fourth wires, but the voltage of the first battery cell cannot be detected. That is, an average voltage value of the first and second battery cells is only detected by means of the first and third wires. In this case, it is impossible to precisely detect the overcharge of the first battery cell even if the first battery cell has been subject to the overcharge state. Accordingly, the first battery cell may be continuously overcharged, thereby causing explosion or ignition of the first battery cell. In addition, it is also difficult to precisely detect the voltage of the second battery cell, so that the secondary battery cell may also be subject to the overcharge.

SUMMARY OF THE INVENTION

Accordingly, the present invention has been made to address one or more of the above-mentioned problems occurring in the prior art, and embodiments of the invention provide a protective circuit of a battery pack, capable of detecting disconnection of a sensing wire, which senses a voltage of a battery cell, while preventing overcharge of the battery cell by shutting off a high current being applied to the battery cell.

In order to accomplish the above, the present invention provides a protective circuit of a battery pack having at least one battery cell, which is coupled in series. A cell voltage detecting unit is coupled to negative and positive electrodes of the battery cell through a sensing wire so as to detect a voltage of the battery cell. A switch unit is coupled to a high current line in series between one terminal of the battery cell and an external terminal. A control unit receives a signal from the cell voltage detecting unit and generates a predetermined control signal based on the signal of the cell voltage detecting unit in order to turn off the switch unit when the battery cell is overcharged or the sensing wire is disconnected.

DETAILED DESCRIPTION OF THE EMBODIMENTS

Figure 1:
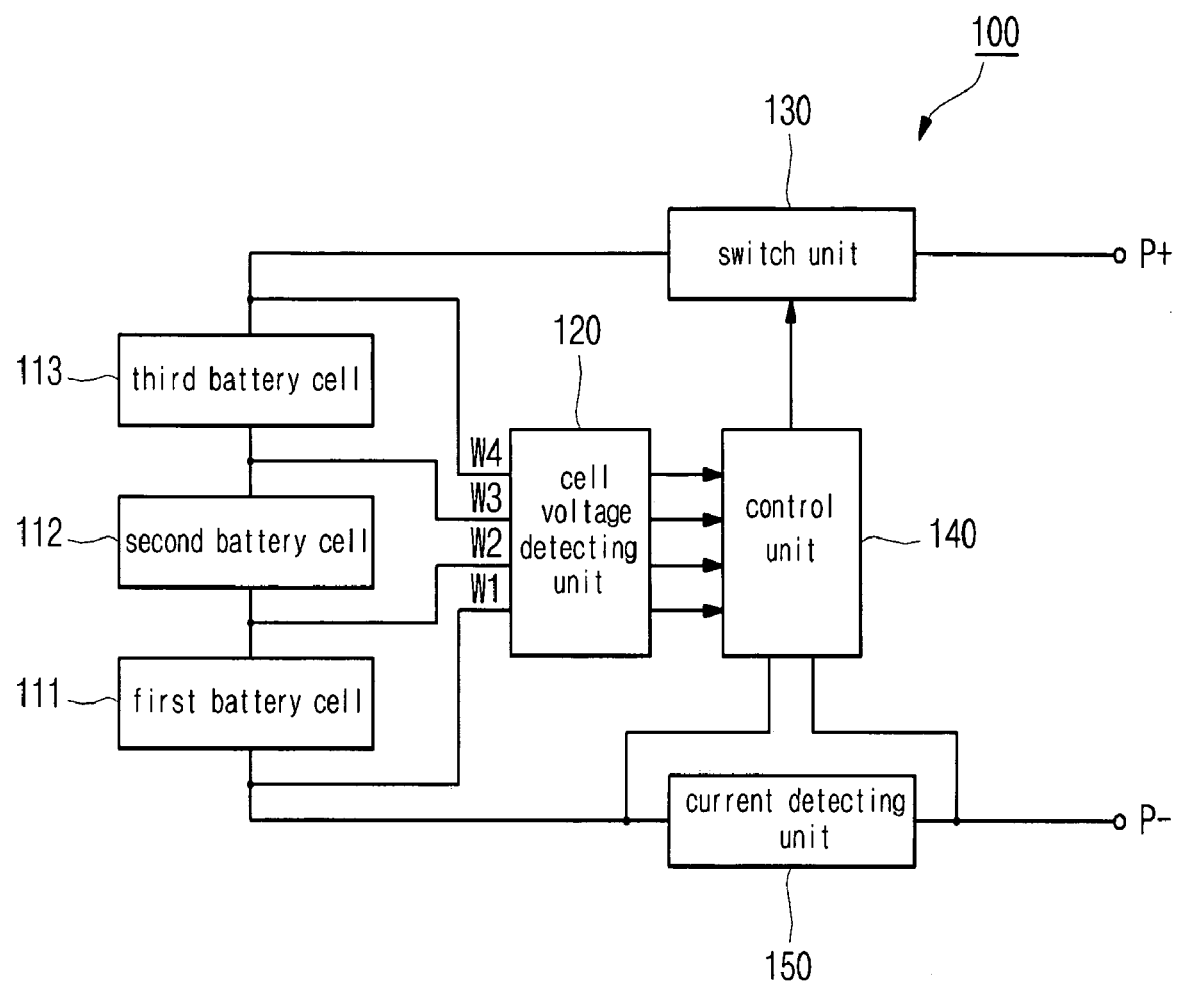
FIG. 1 is a block diagram illustrating the structure of a protective circuit of a battery pack according to one embodiment of the present invention.

As shown in FIG. 1, a protective circuit 100 of a battery pack according to the present invention includes at least one battery cell 111, 112 or 113, a cell voltage detecting unit 120 for detecting the voltage of the battery cell 111, 112 or 113, a switch unit 130 coupled to a high current line in series, and a control unit 140 adapted to operate the switch unit 130 based on a signal of the cell voltage detecting unit 120. The switch unit 130 may be adapted to shut off the high current upon overcharge of the battery cell 111, 112 or 113 or upon disconnection of sensing wires w1, w2, w3 or w4 coupled with the battery cell 111, 112 or 113.

Although three battery cells 111, 112 and 113 are shown in FIG. 1, they are illustrative purposes only. That is, according to another embodiment of the present invention, two battery cells or more than four battery cells can be used. In addition, according to the present invention, the battery cells 111, 112 and 113 are coupled to external terminals P+ and P−, i.e., positive and negative electrode terminals, respectively, and a current detecting unit 150 for detecting the charge current is coupled to the high current line in series.

Figure 2:
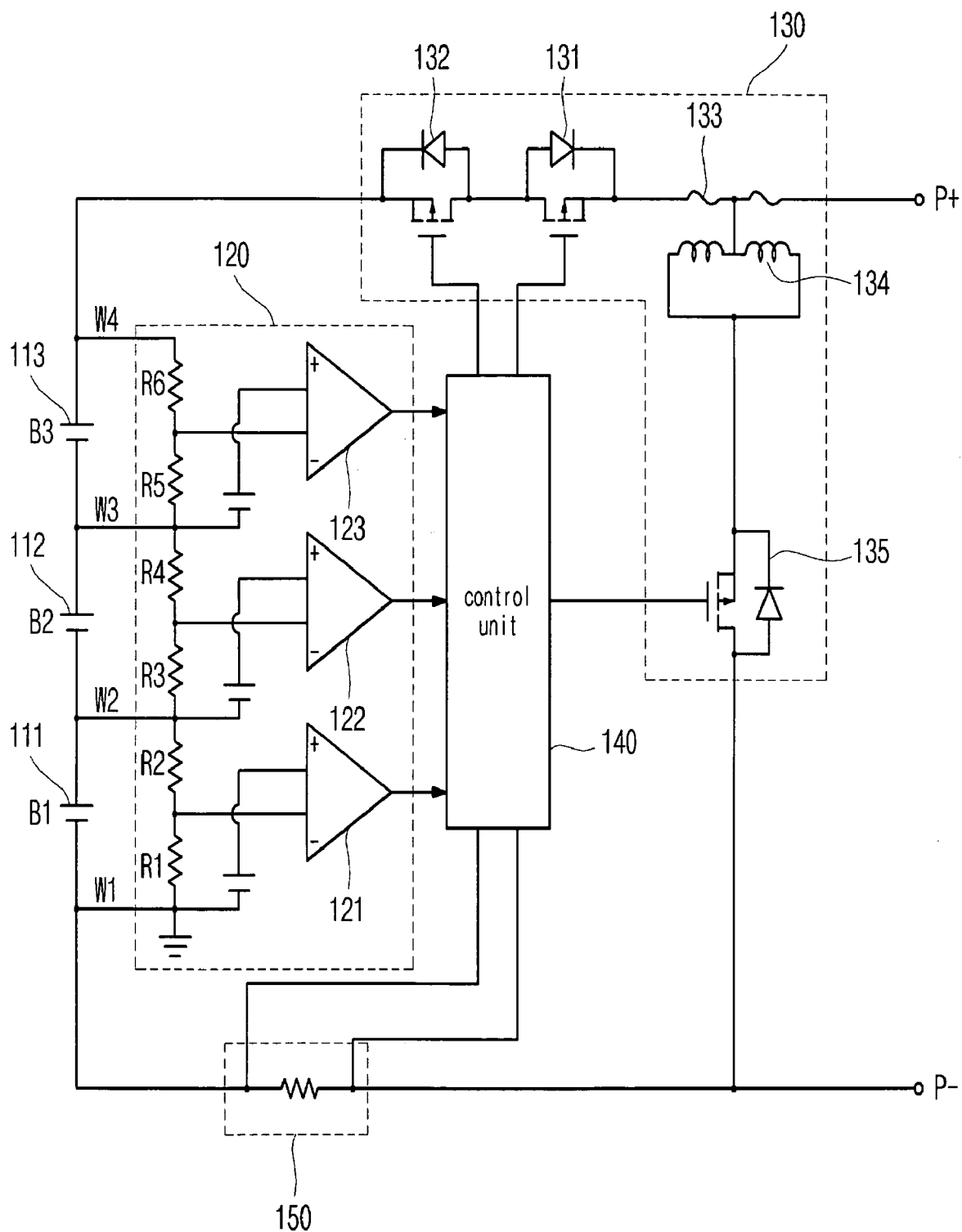
FIG. 2 is a circuit view illustrating a protective circuit of a battery pack according to one embodiment of the present invention.

As shown in FIG. 2, the first, second and third battery cells 111, 112 and 113 are coupled to each other in series. In addition, the first sensing wire w1 is coupled to a negative electrode of the first battery cell 111, the second sensing wire w2 is coupled between a positive electrode of the first battery cell 111 and a negative electrode of the second battery cell 112, the third sensing wire w3 is coupled between a positive electrode of the second battery cell 112 and a negative electrode of the third battery cell 113, and the fourth sensing wire w4 is coupled to a positive electrode of the third battery cell 113, respectively. In addition, the voltage of the first battery cell 111 is detected by means of first and second wires w1 and w2, the voltage of the second battery cell 112 is detected by means of second and third wires w2 and w3, and the voltage of the third battery cell 113 is detected by means of third and fourth wires w3 and w4, respectively.

The cell voltage detecting unit 120 includes a number of voltage-dividing resistors R1 to R6 and a number of comparators 121, 122 and 123. The voltage-dividing resistors R1 and R2 are coupled to the first battery cell 111 in a row, in which the voltage-dividing resistor R1 is grounded. In addition, a reference voltage is supplied through a ground terminal of the voltage-dividing resistor R1. A reference voltage source is coupled to a non-inverting terminal of the comparator 121. In addition, an inverting terminal of the comparator 121 is coupled between the voltage-dividing resistors R1 and R2. Accordingly, if the charge voltage of the first battery cell 111 is higher than the reference voltage, that is, when the voltage $V_{R1}$ applied to the voltage-dividing resistor R1 is higher than the reference voltage, the comparator 121 sends an inverting signal to the control unit 140, so that the control unit 140 can recognize the overcharge state of the first battery cell 111. Similarly, the voltage-dividing resistors R3 and R4 and the comparator 122 are coupled to the second battery cell 112, and the voltage-dividing resistors R5 and R6 and the comparator 123 are coupled to the third battery cell 113 in order to perform the above-mentioned operation. The voltage-dividing resistors R1 and R2, the voltage-dividing resistors R3 and R4, and the voltage-dividing resistors R5 and R6 may each have voltage values different from each other. The reason for this will be described below later.

The cell voltage detecting unit 120 can be fabricated in the form of an integrated circuit (IC) together either with the control unit 140 or separately from the control unit 140. Since the cell voltage detecting unit 120 is an analog circuit and the control unit 140 is a logic circuit, an analog signal processing unit and a logic signal processing unit can be designed to be integrally installed in one semiconductor chip or to be separately installed in two semiconductor chips.

The switch unit 130 is coupled to the high current line between the positive electrode of the third battery cell 113 and the external positive electrode terminal P+. In more detail, the switch unit 130 may include a charge FET device 131 and a discharge FET device 132. In addition, the charge FET device 131 and the discharge FET device 132 may be provided with parasitic diodes in which a gate of each of the FET devices receives a control signal from the control unit 140. Herein, the charge FET device 131 becomes an off state when the battery cell is overcharged and the discharge FET device 132 becomes an off state when the battery cell is over-discharged.

In addition, the switch unit 130 may further include a self control protector. The self control protector may include a fuse 133 coupled to the high current line in series, a coil 134 for melting the fuse 133, and an FET device 135 for applying current to the coil 134. By way of example, the coil 134 may be a resistive heating coil. A gate of the FET device 135 may also receive an output signal of the control unit 140. According to the self control protector having the above structure, the high current is applied to the coil 134 when the control unit 140 outputs a predetermined electric signal to the FET device 135 so that the coil 134 generates heat and the fuse 133 is melted as a result of the heat generated from the coil 134.

The control unit 140 may include a typical IC, a logic circuit, or a microcomputer. Upon receiving information related to the overcharge of the battery cells 111, 112 and 113 or disconnection of the sensing wires w1 to w4 from the cell voltage detecting unit 120, the control unit 140 operates the switch unit 130 so as to prevent the battery cells 111, 112 and 113 from being overcharged.

In addition, the control unit 140 can receive a signal from the current detecting unit 150, which is coupled to the high current line in series. In this case, the control unit 140 operates the switch unit 130 in such a manner that the overcharge current is not applied to the battery cells 111, 112 and 113. For instance, since the current detecting unit 150 is a resistance device, and the control unit 140 already knows the resistance value of the current detecting unit 150, the control unit 140 can calculate the current value applied to the current detecting unit 150 by sensing the voltage applied to both ends of the current detecting unit 150.

The operation of the protective circuit 100 of the battery pack according to the present invention, when a battery cell is overcharged or a sensing wire is disconnected, will now be described.

Herein, VB1 means the voltage of the first battery cell 111. When the first battery cell 111 is overcharged, the voltage $(V_{R1}=[R1/(R1+R2)]*VB1)$ is applied to the voltage-dividing resistor R1 coupled to the first battery cell 111 in a row and the voltage value is inputted into the inverting terminal of the comparator 121. At this time, the reference voltage is being applied to the non-inverting terminal of the comparator 121. The reference voltage has been set to a level lower than the overcharge voltage of the first battery cell 111.

If the first battery cell 111 is overcharged, the voltage $V_{R1}$ applied to the voltage-dividing resistor R1 is higher than the reference voltage. Accordingly, the comparator 121 sends a state-inverting signal to the control unit 140.

Upon receiving the state-inverting signal from the comparator 121, the control unit 140 operates the switch unit 130. For instance, the control unit 140 sends a predetermined control signal to the gate of the charge FET device 131, thereby turning off the FET device 131. Since the charge FET device 131 is provided with the parasitic diode aligned in the direction reverse to the charge current, the high current being applied to the battery cells 111, 112 and 113 can be instantly shut off. In the meantime, the charge current may be continuously applied to the battery cells 111, 112 and 113 even if the charge FET device 131 does not operate. This means that the charge FET device 131 malfunctions. In this case, the control unit 140 sends a predetermined control signal to the gate of another FET device 135, thereby operating the self control protector. Thus, a predetermined current is applied to the coil 134, so that the fuse 133 is melted by means of heat generated from the coil 134. In other words, the self control protector may operate when the charge FET device malfunctions in order to shut off the high current being applied to the battery cells 111, 112 and 113. Although the charge FET device 131 reversibly operates, the self control protector may irreversibly operate.

The voltage of the first battery cell 111 applied to the voltage-dividing resistor R1 before the disconnection of the second sensing wire w2 coupled to the positive electrode of the first battery cell 111 can be calculated as follows.

When it is assumed that the resistance value of each of the voltage-dividing resistors R1 and R2 is 4 kΩ, the resistance value of each of the voltage-dividing resistors R3 and R4 is each 3 kΩ the resistance value of each of the voltage-dividing resistors R5 and R6 is 2 kΩ, and the voltage of each of the first and second battery cells 111 and 112 is each 4V, the voltage $V_{R1}$ applied to the voltage-dividing resistor R1 can be calculated as $V_{R1}=[4/(4+4)]*4=2$, based on the above-described equation $V_{R1}=[R1/(R1+R2)]*VB1$. In other words, the voltage of the first battery cell 111 applied to the voltage-dividing resistor R1 before the disconnection of the second sensing wire w2 is approximately 2V. Since the voltage 2V is lower than the reference voltage, the comparator 121 may not send the inverting signal to the control unit 140.

However, if the second sensing wire w2 is disconnected, the voltages of the first and second battery cells 111 and 112 are applied to the voltage-dividing resistor R1.

In this case, the voltage $V_{R1}$ applied to the voltage-dividing resistor R1 is represented as $V_{R1}=[R1/(R1+R2+R3+R4)]*(VB1+VB2)$, wherein VB2 is a voltage of the second battery cell 112. In other words, the voltage $V_{R1}$ applied to the voltage-dividing resistor R1 is $V_{R1}=[4/(4+4+3+3)]*(4+4)=2.28V$.

Thus, if the second sensing wire w2 is disconnected, the voltage (2.28V) applied to the voltage-dividing resistor R1 is higher than the voltage (2V) applied to the voltage-dividing resistor R1 before the second sensing wire w2 is disconnected. The voltage (2.28V) applied to the voltage-dividing resistor R1 when the second sensing wire w2 is disconnected is higher than the reference voltage, so the comparator 121 sends the inverting signal to the control unit 140 in the same manner as when the first battery cell 111 is overcharged.

Therefore, the control unit 140 operates the switch unit 130. That is, the control unit 140 operates the charge FET device 131 or the self control protector, thereby stopping the charge operation and completing the operation of the protective circuit of the battery pack according to the present invention.

The voltage of the second battery cell 112 applied to the voltage-dividing resistor R3 before the disconnection of the third sensing wire w3 coupled to the positive electrode of the second battery cell 112 can be calculated as follows.

The voltage applied to the voltage-dividing resistor R3 can be calculated as $V_{R3}=[3/(3+3)]*4=2$ based on the equation $V_{R3}=[R3/(R3+R4)]*VB2$. In other words, the voltage of the second battery cell 112 applied to the voltage-dividing resistor R3 before the disconnection of the third sensing wire w3 is approximately 2V. Since the voltage 2V is lower than the reference voltage, the comparator 122 may not send the inverting signal to the control unit 140.

However, if the third sensing wire w3 is disconnected, the voltages of the second and third battery cells 112 and 113 are applied to the voltage-dividing resistor R3.

In this case, the voltage applied to the voltage-dividing resistor R3 is represented as $V_{R3}=[R3/(R3+R4+R5+R6)]*(VB2+VB3)$, wherein VB3 is a voltage of the third battery cell 113. In other words, the voltage applied to the voltage-dividing resistor R3 is $V_{R3}=[3/(3+3+2+2)]*(4+4)=2.4V$.

Thus, if the third sensing wire w3 is disconnected, the voltage (2.4V) applied to the voltage-dividing resistor R3 is higher than the voltage (2V) applied to the voltage-dividing resistor R3 before the third sensing wire w3 is disconnected. The voltage (2.4V) applied to the voltage-dividing resistor R3 when the third sensing wire w3 is disconnected is set to be higher than the reference voltage, so the comparator 122 sends the inverting signal to the control unit 140 as if the second battery cell 112 is overcharged.

Therefore, the control unit 140 operates the switch unit 130. That is, the control unit 140 operates the charge FET device 131 or the self control protector, thereby stopping the charge operation and completing the operation of the protective circuit of the battery pack according to the present invention.

As described above, the protective circuit of the battery pack according to the present invention can precisely detect the disconnection of the sensing wires, which sense the voltage of each battery cell, and instantly shut off the high current being applied to the battery cells when the sensing wires are disconnected, thereby preventing the battery cells from being overcharged.

Although an embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A protective circuit of a battery pack, the protective circuit comprising:
   a plurality of battery cells connected in series;
   a cell voltage detecting unit coupled to negative and positive electrodes of the battery cells through sensing wires for detecting a voltage of each of the battery cells, the cell voltage detecting unit having common circuitry for providing both:
      signals indicating a disconnection of one or more of the sensing wires, and
      signals indicating an overcharging of one or more of the battery cells,
      wherein one of the signals indicating a disconnection of one of the sensing wires has a voltage higher than a signal corresponding to a cell voltage of a corresponding one of the battery cells which is not overcharged before said one of the sensing wires is disconnected;
   a switch unit coupled to a high current line in series between an end terminal of the plurality of battery cells and a first external terminal; and
   a control unit adapted to generate a control signal to operate the switch unit in response to both the signals indicating a disconnection of one or more of the sensing wires and the signals indicating an overcharging of one or more of the battery cells.

2. The protective circuit as claimed in claim 1, wherein the cell voltage detecting unit comprises:
   for each battery cell:
      a voltage divider coupled across the battery cell;
      a reference voltage source coupled to the voltage divider; and
      a comparator having:
         a first input terminal coupled to the voltage divider;
         a second input terminal coupled to the reference voltage source; and
         an output terminal coupled to the control unit.

3. The protective circuit as claimed in claim 1, wherein the cell voltage detecting unit comprises
   for each battery cell:
      a voltage divider coupled between negative and positive electrodes of the battery cell through a sensing wire;
      a reference voltage source coupled to the negative electrode of the battery cell; and
      a comparator having:
         a non-inverting terminal coupled to the reference voltage source; and
         an inverting terminal coupled to the voltage divider to send an inverting signal to the control unit when a voltage applied to the non-inverting terminal is higher than a voltage applied to the inverting terminal.

4. The protective circuit as claimed in claim 3, wherein each of a plurality of resistance values of the voltage dividers coupled to the battery cells are different from each other.

5. The protective circuit as claimed in claim 3, wherein the comparator sends the inverting signal to the control unit upon disconnection of the sensing wire coupled to the battery cell.

6. The protective circuit as claimed in claim 1, wherein the control unit sends the control signal to the switch unit to turn off the switch unit when an inverting signal is transmitted thereto from the cell voltage detecting unit.

7. The protective circuit as claimed in claim 1, further comprising a current detecting unit coupled to the high current line in series between an opposing end terminal of the battery cells and a second external terminal to detect a current applied to the battery cells.

8. The protective circuit as claimed in claim 1, wherein the switch unit includes a charge FET device and a discharge FET device, which are coupled to each other in series, and the control signal of the control unit is inputted into gates of the charge FET device and the discharge FET device.

9. The protective circuit as claimed in claim 8, wherein the charge FET device of the switch unit is turned off when the control signal of the control unit is applied to the charge FET device due to a disconnection of the sensing wire.

10. The protective circuit as claimed in claim 8, wherein the switch unit comprises a self control protector and an FET device for operating the self control protector.

11. The protective circuit as claimed in claim 1, wherein the switch unit comprises:
a self control protector; and
an FET device for operating the self control protector.

12. The protective circuit as claimed in claim 11, wherein the self control protector comprises:
at least one fuse coupled to the high current line in series between the end terminal of the battery cells and the external terminal; and
a coil aligned between fuses for applying heat to the fuse, in which the coil is coupled to the battery cell through the FET device and a gate of the FET device receives the control signal of the control unit.

13. The protective circuit as claimed in claim 12, wherein the control unit sends the control signal to the gate of the FET device upon the disconnection of a sensing wire, so that the self control protector applies a current to the coil, thereby melting the fuse as a result of heat generated from the coil.

14. The protective circuit as claimed in claim 1, wherein the cell voltage detecting unit forms an integrated circuit together with the control unit.

15. The protective circuit as claimed in claim 1, wherein the cell voltage detecting unit is fabricated in a form of an integrated circuit separately from the control unit.

16. The protective circuit as claimed in claim 1, wherein the cell voltage detecting unit comprises:
a plurality of cell-voltage subcircuits connected in series, each of the battery cells being connected in parallel to one of the cell-voltage subcircuits through the sensing wires, each of the cell-voltage subcircuits including:
a comparator having a first input terminal, a second input terminal, and an output terminal, the output terminal being coupled to the control unit;
a voltage divider including a first resistor and a second resistor, the first resistor coupled to a first sensing wire and to the second input terminal, the second resistor coupled to a second sensing wire and to the second input terminal;
a reference voltage source coupled to the first sensing wire and to the first input terminal.

17. A protective circuit of a battery pack, the protective circuit comprising:
a plurality of battery cells connected in series;
a cell voltage detecting unit coupled to negative and positive electrodes of the battery cells through sensing wires for detecting a voltage of each of the battery cells, the cell voltage detecting unit having common circuitry for providing both:
signals indicating a disconnection of one or more of the sensing wires, and
signals indicating an overcharging of one or more of the battery cells;
a switch unit coupled to a high current line in series between an end terminal of the plurality of battery cells and a first external terminal; and
a control unit adapted to generate a control signal to operate the switch unit in response to both the signals indicating a disconnection of one or more of the sensing wires and the signals indicating an overcharging of one or more of the battery cells,
wherein the cell voltage detecting unit comprises for each of the battery cells:
a voltage divider coupled between the negative and positive electrodes of a corresponding one of the battery cells through a sensing wire;
a reference voltage source coupled to the negative electrode of the corresponding battery cell; and
a comparator having:
a non-inverting terminal coupled to the reference voltage source; and
an inverting terminal coupled to the voltage divider to send an inverting signal to the control unit when a voltage applied to the non-inverting terminal is higher than a voltage applied to the inverting terminal,
wherein the comparator sends the inverting signal to the control unit upon disconnection of the sensing wire coupled to the corresponding battery cell.

18. A protective circuit of a battery pack, the protective circuit comprising:
a plurality of battery cells connected in series;
a cell voltage detecting unit coupled to negative and positive electrodes of the battery cells through sensing wires for detecting a voltage of each of the battery cells, the cell voltage detecting unit having common circuitry for providing both:
signals indicating a disconnection of one or more of the sensing wires, and
signals indicating an overcharging of one or more of the battery cells;
a switch unit coupled to a high current line in series between an end terminal of the plurality of battery cells and a first external terminal; and
a control unit adapted to generate a control signal to operate the switch unit in response to both the signals indicating a disconnection of one or more of the sensing wires and the signals indicating an overcharging of one or more of the battery cells,
wherein the switch unit comprises a charge FET device and a discharge FET device, which are coupled to each other in series, and the control signal of the control unit is inputted into gates of the charge FET device and the discharge FET device, and
wherein the charge FET device of the switch unit is turned off when the control signal of the control unit is applied to the charge FET device due to a disconnection of the sensing wire.

19. A protective circuit of a battery pack, the protective circuit comprising:
a plurality of battery cells connected in series;

a cell voltage detecting unit coupled to negative and positive electrodes of the battery cells through sensing wires for detecting a voltage of each of the battery cells, the cell voltage detecting unit having common circuitry for providing both:
  signals indicating a disconnection of one or more of the sensing wires, and
  signals indicating an overcharging of one or more of the battery cells;
a switch unit coupled to a high current line in series between an end terminal of the plurality of battery cells and a first external terminal; and
a control unit adapted to generate a control signal to operate the switch unit in response to both the signals indicating a disconnection of one or more of the sensing wires and the signals indicating an overcharging of one or more of the battery cells,
wherein the switch unit comprises:
  a self control protector; and
  an FET device for operating the self control protector,
  wherein the self control protector comprises:
    at least one fuse coupled to the high current line in series between the end terminal of the battery cells and the external terminal; and
    a coil aligned between fuses for applying heat to the fuse, in which the coil is coupled to the battery cell through the FET device and a gate of the FET device receives the control signal of the control unit, and
wherein the control unit sends the control signal to the gate of the FET device upon the disconnection of a sensing wire, so that the self control protector applies a current to the coil, thereby melting the fuse as a result of heat generated from the coil.

* * * * *